United States Patent [19]
Tanaka et al.

[11] Patent Number: 5,934,981
[45] Date of Patent: Aug. 10, 1999

[54] METHOD FOR POLISHING THIN PLATE AND APPARATUS FOR POLISHING

[75] Inventors: Koichi Tanaka; Toshihiro Tsuchiya; Koji Morita; Tsutomu Takaku, all of Nishi-shirakawa-gun, Japan

[73] Assignee: Shin-Etsu Handotai Co., Ltd., Tokyo, Japan

[21] Appl. No.: 08/972,680

[22] Filed: Nov. 18, 1997

[30] Foreign Application Priority Data

Nov. 27, 1996 [JP] Japan ................................. 8-316634

[51] Int. Cl.$^6$ ....................................................... B24B 1/00
[52] U.S. Cl. ........................... 451/41; 451/259; 451/384
[58] Field of Search ..................... 156/345 LP; 216/88, 216/89; 451/259, 262, 268, 269, 283, 285, 287, 289, 28, 41, 56, 385, 388, 397, 398, 402, 42, 384

[56] References Cited

U.S. PATENT DOCUMENTS

| | | | |
|---|---|---|---|
| 4,010,583 | 3/1977 | Highberg | 451/56 |
| 5,140,782 | 8/1992 | Mecteau et al. | 451/42 |
| 5,380,387 | 1/1995 | Salamon et al. | 451/42 |
| 5,605,499 | 2/1997 | Sugiyama et al. | 451/41 |
| 5,755,614 | 5/1998 | Adams et al. | 451/41 |
| 5,759,087 | 6/1998 | Masumura et al. | 451/41 |

FOREIGN PATENT DOCUMENTS

| | | |
|---|---|---|
| 0 454 362 | 10/1991 | European Pat. Off. . |
| 0 672 499 | 9/1995 | European Pat. Off. . |
| 06 320414 | 11/1994 | Japan . |

*Primary Examiner*—David A. Scherbel
*Assistant Examiner*—Derris H. Banks
*Attorney, Agent, or Firm*—Oliff & Berridge, PLC

[57] ABSTRACT

A method and an apparatus, for polishing a thin plate. The method comprises the steps of: rotating a holding plate on one surface of which the thin plate is held to adhere; and bringing the thin plate held on the rotating holding plate into contact with a polishing pad mounted on a surface of a rotating turn table, to polish the thin plate. The step of polishing the one surface of the holding plate is carried out by using the polishing pad for polishing the thin plate before the thin plate is held to adhere on the one surface of the holding plate.

14 Claims, 3 Drawing Sheets

METHOD FOR POLISHING THIN PLATE AND APPARATUS FOR POLISHING

BACKGROUND OF THE INVENTION

1. Field of the Invention

The present invention relates to a technique for polishing a thin plate, in particular, to a polishing method which can polish a thin plate such as a semiconductor wafer (hereinafter, it may be simply referred to "wafer"), with a high flatness, and to a polishing apparatus.

2. Description of Related Art

In a process for fabricating a semiconductor integrated circuit, with the requirement of larger scale integration of recent semiconductor devices, the design rule for fabricating a device has a tendency to become finer and the depth of focus required for a stepper becomes shallower. Therefore, the requirement for the flatness of a semiconductor wafer which is the objective material becomes larger. Hereinafter, the term "flatness" means a uniformity with respect to variations in thickness of the wafer because use of a vacuum-chuck to hold the wafer in the stepper reforms a deformation of the wafer to some extent.

Generally, polishing of a wafer is carried out by pressing the wafer against a polishing pad while giving a relative motion between the wafer and the polishing pad and supplying an abrasive slurry. For example, such a polishing apparatus for a thin plate has a structure shown in FIG. 7.

In FIG. 7, the reference numeral 1 denotes a wafer which is a thin plate. The wafer 1 was processed to have upper and lower surfaces precisely parallel to each other and a uniform thickness, by slicing a silicon (Si) single crystal ingot by using an inner diameter saw slicing machine, thereafter by carrying out a lapping step and the like. A wafer or a plurality of wafers 1 are held on the lower surface of a holding plate 2. Both surfaces of the holding plate 2 are processed to have flat planes precisely parallel to each other. On the upper surface of the holding plate 2, a top ring 3 is provided as a loading member for giving a pressing force. The top ring 3 is attached to the lower end of a rotating shaft 4 and is driven to rotate at a predetermined rotational speed by a driving mechanism (not shown) which is attached to the rotating shaft 4 while giving a predetermined pressing force downward.

Under the holding plate 2, a turn table 5 having an approximate disc-shape is horizontally disposed in parallel with the lower surface of the holding plate 2. The turn table 5 is rotatable on a rotating shaft 6 which is attached to the central portion of the lower surface of the turn table 5, at a constant rotational speed. The upper surface of the turn table 5 is processed to have a precise flat plane and a polishing pad 7 is adhered thereon. The polishing pad 7 is made of unwoven cloth of a visco-elastic body having a suitable toughness and flexibility. An abrasive slurry 8 including abrasive grains of colloidal silica is supplied onto the central portion of the upper surface of the polishing pad 7 by a pump 9. The reference numeral 10 denotes a drain receiver for receiving the used abrasive slurry and the reference numeral 11 denotes an abrasive slurry tank.

In such a polishing device, the wafer 1 is held to adhere on the lower surface of the holding plate 2 by using vacuum suction, wax-adhesion, or the like, and the temperature of the surface of the polishing pad 7 on the surface of the wafer 1 and the polishing condition, e.g., a relative speed between the wafer 1 and the polishing pad 7 and the like, are kept constant, in order to obtain a desired flatness of the wafer 1.

Because the wafer 1 is sandwiched between the holding plate 2 and the turn table 5 through the elastic polishing pad 7, the portion of the wafer having a larger thickness receives a larger contact pressure than that of the portion having a smaller thickness, so that the portion having a larger thickness is preferentially polished. As the result, the surface of the wafer 1 becomes flat gradually as the processing progresses. Further, in order to obtain a higher flatness, it is required to make the surfaces of the holding plate 2 and the turn table 5 flat, to make the thickness of the polishing pad 7 uniform, to remove the heat of the surface of the polishing pad 7 caused by friction by flowing a cooling water through the inside of the turn table 5, and the like.

When the wafer 1 is polished by the above-described conventional method, removal of Si is carried out by the so-called mechano-chemical function which compounds a mechanical function and a chemical function. Therefore, there are a lot of factors which have an effect on flatness of the wafer. For example, they are the surface roughness, the characteristics of the surface of the polishing pad 7 such as a loading condition due to the removed material by polishing or the like, the characteristics of the body of the polishing pad 7 such as the thickness, the viscoelasticity or the like, the surface temperature of the polishing pad 7 which closely relates to a frictional heat generated by rubbing the wafer 1 with the polishing pad 7, the degree of the abrasive slurry 8 reaching the surface of the wafer 1, and the like.

The load applied to the polishing pad 7 varies with the position in the polishing pad 7 and is not uniform, for reason of its structure. The polishing pad 7 is influenced by the applied load. For example, at a portion thereof to which a larger load is applied, the surface roughness becomes higher (flatter) by friction caused by rubbing motion, much loading due to products by polishing are caused, and the polishing pad 7 is apt to become thin and hard by the applied pressure. That is, the ability of the polishing pad 7 to remove the material changes (ordinarily, it is degraded) and becomes non-uniform with respect to the portion of the polishing pad 7. The degree of such non-uniformity varies with time. There is also a problem that the cooling of the turn table 5 causes thermal deformation thereof.

That is, even if conditions to improve the flatness of the wafer 1 were established, practically, there was a limitation of flatness which could be obtained for the wafer 1 by thermal deformation of the turn table 5, wear of the polishing pad 7, non-uniformity of creep deformation, and change of them with the passage of time.

SUMMARY OF THE INVENTION

The present invention was developed in view of the above-described problems. Therefore, an object of the present invention is to provide a thin plate polishing method and a thin plate polishing apparatus, which can obtain a thin plate having a high flatness easily.

That is, in accordance with an aspect of the present invention, the method for polishing a thin plate, comprising the steps of: rotating a holding plate on one surface of which the thin plate is held to adhere; bringing the thin plate held on the rotating holding plate into contact with a polishing pad mounted on a surface of a rotating turn table, to polish the thin plate; and polishing the one surface of the holding plate by using the polishing pad for polishing the thin plate before the thin plate is held to adhere on the one surface of the holding plate.

The thin plate such as a wafer or the like, to which the present invention is applied, has a good flexibility to a small amount of deformation because of its very small thickness. Therefore, even if the surface of the holding plate is bent a little with respect to the flat plane, the thin plate can be easily adhered to the surface of the holding plate. Because the thin plate is processed while it is sandwiched between the holding plate and the polishing pad, it is considered that the relationship between their shapes is very important and therefore a shape of the holding plate which can make the thin plate flat must exist. From such a viewpoint, the inventors performed a processing (holding plate polishing) of the holding plate by using the polishing pad for polishing the thin plate, as described above. In order to carry out such holding plate polishing, it is preferable to perform processing under the same polishing condition, for example, polishing pressure, relative speed between the holding plate and the polishing pad, type of the abrasive slurry, temperature and the like, as that of the thin plate processing. More preferably, the surface for holding the thin plate, of the holding plate is made of the same material as the thin plate, and the step of polishing the holding surface for holding the thin plate, of the holding plate is carried out under the same condition as that of the thin plate. The thin plate may be one selected from the group consisting of an Si wafer, an $SiO_2$ mask, and an SOI wafer. The thin plate may comprise a semiconductor substrate, a wiring of such materials as metal, metal silicide, polysilicon or the like formed on the substrate, and an insulating film deposited on the wiring and the substrate, and the method is performed for planarization of the insulating film of the thin plate.

In accordance with another aspect of the present invention, the polishing apparatus for polishing a thin plate, comprising: a rotatable holding plate for holding to adhere the thin plate on one surface thereof; and a rotatable turn table having a polishing pad thereon, for polishing the thin plate by bringing the rotating thin plate into contact with the rotating polishing pad; wherein the one surface of the holding plate, for holding to adhere the thin plate is made of a material which is polished in approximately the same degree as the thin plate when the one surface is polished under the same polishing condition as that of the thin plate. Preferably, a plurality of through holes for vacuum suction are formed in the holding plate in order to hold to adhere the thin plate on one surface thereof.

The reason for having such a structure is as follows. If the holding surface for holding the thin plate is made of a material hard to process such as a ceramics, e.g., $Al_2O_3$, because it cannot be polished by using an apparatus for polishing a thin plate, another processing apparatus have to be used. Even if the holding surface of the holding plate is made of a material easy to polish, the material of the holding surface having a property to be polished differently from that of the thin plate is not desirable for making the thin plate flat because the shape of the holding surface formed by using the polishing pad comes to be different from that of the thin plate by using the same polishing pad. On the contrary, according to the polishing apparatus of the present invention, because the properties to be polished, of the holding surface and the thin plate are the same or similar to each other, the holding surface can be polished by the same polishing apparatus as one for the thin plate, and it is possible to polish the thin plate with high flatness since the holding surface and the thin plate can be made to have approximately the same surface shapes by the polishing pad.

In order to provide the holding plate having such a surface for holding the thin plate, one surface of the holding plate, for holding to adhere the thin plate may comprise fine powder of material which is polished in approximately the same degree as the thin plate when the one surface is polished under the same polishing condition as that of the thin plate, and binding resin material for binding the fine powder material.

In accordance with another aspect of the present invention, the polishing apparatus for polishing a thin plate, comprises: a rotatable holding plate for holding to adhere an Si thin plate on one surface thereof; and a rotatable turn table having a polishing pad thereon, for polishing the Si thin plate by bringing the rotating Si thin plate into contact with the rotating polishing pad; wherein the one surface of the holding plate, for holding to adhere the Si thin plate is made of Si.

In accordance with a further aspect of the present invention, the polishing apparatus for polishing a thin plate, comprises: a rotatable holding plate for holding to adhere an Si thin plate on one surface thereof; and a rotatable turn table having a polishing pad thereon, for polishing the Si thin plate by bringing the rotating Si thin plate into contact with the rotating polishing pad; wherein the one surface of the holding plate, for holding to adhere the thin plate comprises Si fine powder and binding resin material for binding the Si fine powder.

The surface of the holding plate, for holding to adhere the thin plate, comprising Si or Si fine powder bound with a resin material is preferable for polishing an Si wafer.

The holding plate may comprise a surface member for holding to adhere the thin plate on one surface thereof, which is made of a material which is polished in approximately the same degree as the thin plate when the one surface is polished under the same polishing condition as that of the thin plate, and a plate body attached to the surface member. The surface member may be made of Si single crystal and the plate body is made of $Al_2O_3$. The surface member may also comprise fine powder of Si or $CaCO_3$, and binding resin material for binding the fine powder.

The binding resin material may be an epoxy resin and the plate body is made of $Al_2O_3$, and a plurality of through holes for vacuum suction are formed through the surface member and the plate body. According to the polishing apparatus having such a structure, it is possible to easily form the through holes for vacuum suction in the epoxy resin layer by supplying compressed air with a high temperature through through holes formed in the plate body to make through holes in the soft epoxy layer and thereafter to harden it.

As described above, according to the method for polishing a thin plate of the present invention, because the holding surface of the holding plate is polished by using the polishing pad for polishing the thin plate before the thin plate is held to adhere on the holding surface of the holding plate, it is possible to obtain a thin plate having a very high flatness easily.

Because the holding surface of the holding plate, for holding to adhere the thin plate is made of a material which is polished in approximately the same degree as the thin plate when the holding surface is polished under the same polishing condition as that of the thin plate, it is possible to process the holding surface for holding the thin plate in a desired shape easily by the apparatus for polishing a thin plate, and to obtain a thin plate having a high flatness.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein.

PREFERRED EMBODIMENT OF THE INVENTION

Hereinafter, embodiments of the polishing method and the polishing apparatus, according to the present invention will be explained.

Figure 2:
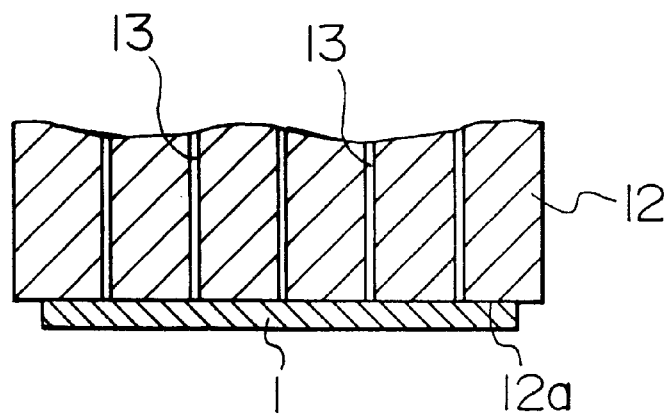
FIG. 2 is a vertical sectional view of the principal portion of the polishing apparatus according to a first embodiment of the present invention.
Figure 7:
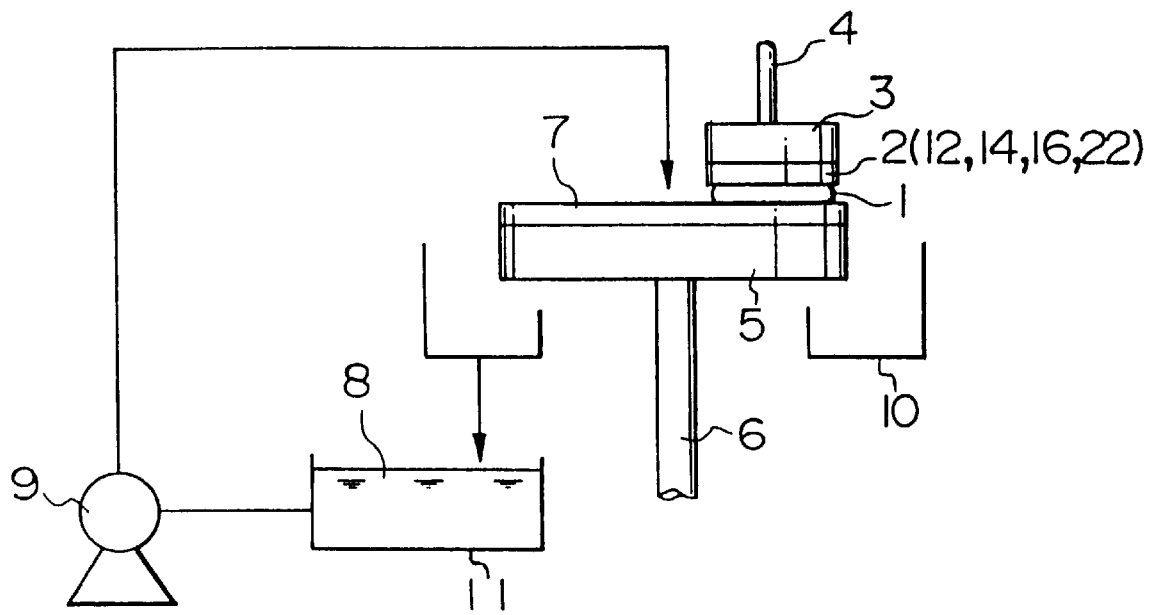
FIG. 7 is a schematic side view of an example of a apparatus for polishing a thin plate.

A whole system of the polishing apparatus according to an embodiment of the present invention is shown in FIG. 7. A first embodiment of the holding plate 2 in this figure is shown in FIG. 2. In FIG. 2, the holding plate 12 is made of silicon (Si) single crystal which is the same material as the wafer (thin plate) 1. In the holding plate, a plurality of through holes 13 which is communicated with a vacuum pump through a vacuum passage are formed vertically. The wafer 1 is held to adhere on a holding surface 12a for holding a thin plate, of the holding plate 12 by vacuum suction through the through holes 13.

Figure 1A:
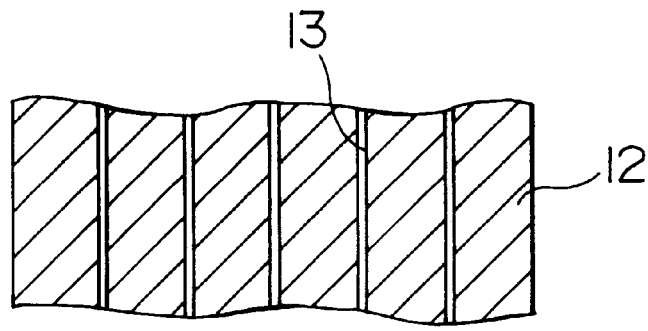
FIGS. 1A to 1C are vertical sectional views showing steps of the polishing method according to a first embodiment of the present invention.
Figure 1B:
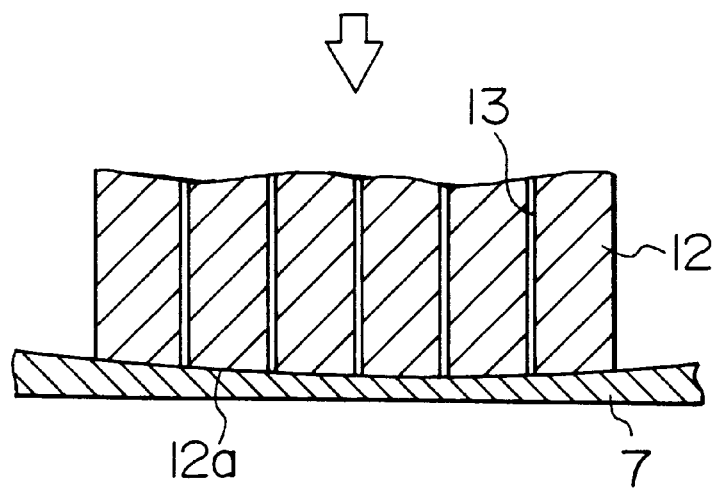
Figure 1C:
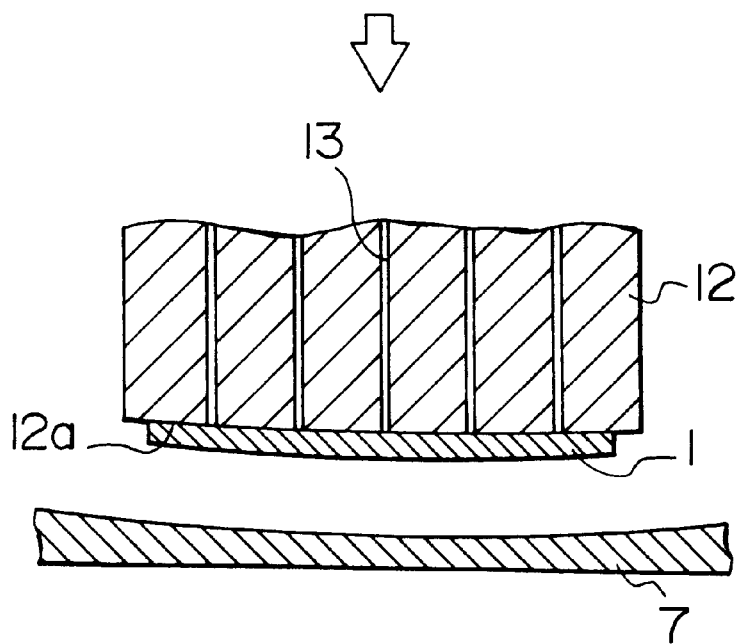

In order to polish the wafer with a higher flatness, first, the holding plate 12 is set on the top ring 3 of the polishing apparatus without holding the wafer 1 on the holding plate 12 by vacuum suction, as shown in FIG. 1A. The lower surface (holding surface) 12a of the holding plate 12 is brought into contact with a polishing pad 7 mounted on the upper surface of the rotating turn table 5, with applying a predetermined pressure, so that the holding surface 12a is polished under the same condition as one for polishing the wafer 1, as shown in FIG. 1B. Such a polishing is carried out while rotating the holding plate 12 through the top ring 3 and rotating the polishing pad 7 through the rotating turn table 5, and supplying the abrasive slurry 8 to the polishing pad 7, as shown in FIG. 7. As the result, the holding surface 12a has a shape like one to which the upper surface of the polishing pad 7 is transferred. Thereafter, the wafer 1 is held to adhere on the holding surface 12a of the set holding plate 12 by vacuum suction and the lower surface of the wafer 1 is polished by the polishing pad 7, in the same manner and under the same polishing condition, as polishing for the holding surface 12a of the holding plate 12, as shown in FIG. 1C. FIGS. 1A to 1C show polishing steps in the case of the upper surface of the polishing pad 7 curved a little.

According to the embodiment, because the whole holding plate 12 is made of the same material as the wafer 1, it is possible to polish the holding plate 12 by using the polishing pad 7 for polishing the wafer 1 easily. By polishing both the holding plate 12 and the wafer 1 by using the same polishing pad 7, it is possible to secure a higher flatness of the wafer 1 even if the condition or the like of the polishing pad 7 was changed with the passage of time.

Figure 3:
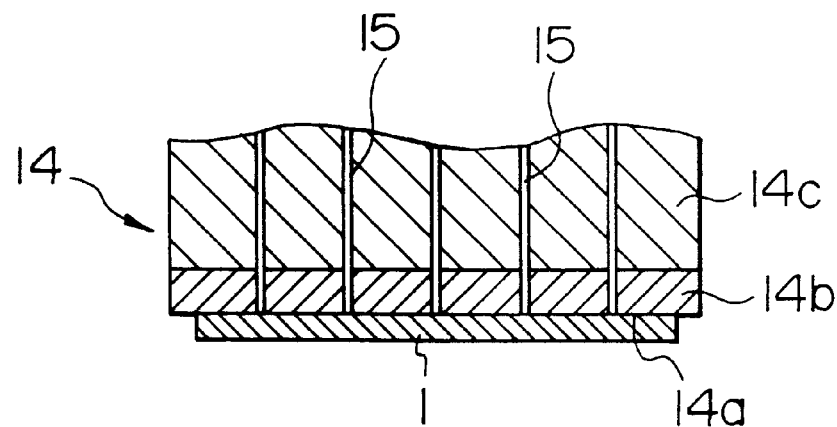
FIG. 3 is a vertical sectional view of the principal portion of the polishing apparatus according to a second embodiment of the present invention.

A polishing apparatus according to the second embodiment of the present invention is shown in FIG. 3. In FIG. 3, the holding plate 14 comprises a surface member 14b for adhering to hold the wafer (thin plate) 1 on the lower surface (holding surface) 14a thereof and a plate body 14c which is adhered to the surface member 14b by an epoxy adhesive or the like. The surface member 14b is made of a material which can be polished in approximately the same degree as the thin plate 1 when the lower surface 14a is polished under the same polishing condition as that of the thin plate 1, e.g., a silicon single crystal or the like. Therefore, when the thin plate 1 is a silicon wafer, preferably, the surface member 14b is also made of a silicon single crystal, and the plate body 14c is made of, for example, $Al_2O_3$ or the like. In the holding plate 14, a plurality of through holes 15 which pass through the surface member 14b and the plate body 14c, are formed for holding to secure the wafer 1 on the holding surface 14a of the surface member 14b by vacuum suction.

In the second embodiment, in order to polish the wafer 1 with a higher flatness, the holding surface 14a of the surface member 14b is also polished by using the polishing pad 7 for polishing the wafer 1. Thereafter, the wafer 1 is held to adhere on the holding surface 14a of the set holding plate 14 by vacuum suction and the lower surface of the wafer 1 is polished by the polishing pad 7, in the same manner and under the same polishing condition, as the preceding polishing step for the holding surface 14a, like the first embodiment. According to this embodiment, it is possible to provide approximately the same function and the same advantageous effects as the first embodiment.

Figure 4:
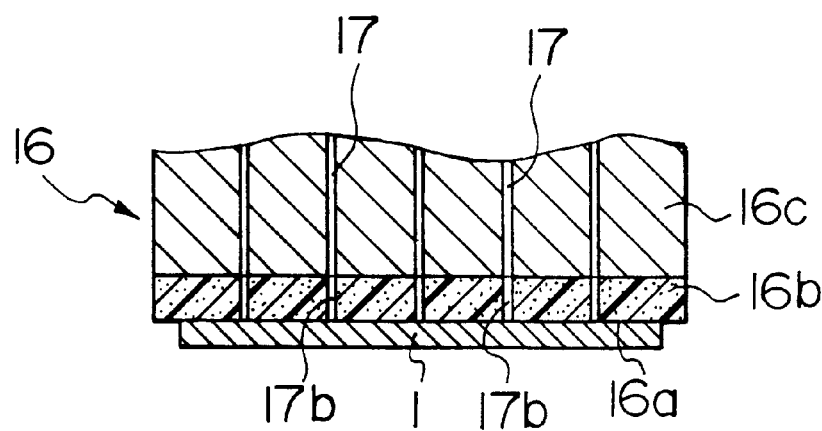
FIG. 4 is a vertical sectional view of the principal portion of the polishing apparatus according to a third embodiment of the present invention.

A polishing apparatus according to the third embodiment of the present invention is shown in FIG. 4. In FIG. 4, the holding plate 16 comprises a surface member 16b for adhering to hold the wafer 1 on the lower surface 16a thereof and a plate body 16c which is adhered to the surface member 16b. The plate body 16c is made of $Al_2O_3$ or the like. The surface member 16b comprises Si fine powder having a particle diameter of 20–100 $\mu$m and binding resin material, e.g., epoxy resin, for binding the Si fine powder. In the holding plate 16, a plurality of through holes 17 which pass through the surface member 16b and the plate body 16c, are formed for holding to secure the wafer 1 on the holding surface 16a of the surface member 16b by vacuum suction.

In order to manufacture the holding plate 16, first, epoxy resin containing the above-described Si fine powder is coated directly to a surface of the plate body 16c which has a plurality of through holes 17 for vacuum suction formed therein, with a predetermined thickness, and the surface of the epoxy coating layer for the surface member 16b is made flat by a knife edge. Thereafter, through holes 17b are formed to communicate with the through holes 17 of the holding plate 16c, in the coating layer 16b by supplying compressed air through the through holes 17 of the holding plate 16c. The epoxy coating layer 16b having the formed through holes 17b is hardened by making the temperature of the supplied air higher than the hardening temperature of epoxy resin. According to such a method, it is possible to form the through holes 17b very easily. Thereafter, a lapping treatment is performed to the lower surface to be the holding surface 16a, of the hardened coating layer 16b to make it flatter.

In the third embodiment, in order to polish the wafer 1 with a higher flatness, the holding surface 16a of the surface member 16b is also polished by using the polishing pad 7 for polishing the wafer 1. Thereafter, the wafer 1 is held to adhere on the holding surface 16a of the set holding plate 16 by vacuum suction and the lower surface of the wafer 1 is polished by the polishing pad 7, in the same manner and under the same polishing condition, as polishing for the holding surface 16a, like the first embodiment. According to this embodiment, it is possible to provide approximately the same function and the same advantageous effects as the first embodiment.

Instead of forming the surface member for the thin plate by binding the Si fine powder with an epoxy binder, it may form the surface member by binding fine powder of a material which is polished in approximately the same degree as the thin plate when the surface thereof is polished under the same polishing condition as that of the thin plate, for example, of $CaCO_3$, with a binder of thermosetting resin such as epoxy or the like. According to use of such a surface member, it is possible to improve the polishing speed in comparison with use of only a thermosetting resin. For example, when polishing was carried out under a polishing condition including a polishing pressure of 500 g/cm$^2$, a relative speed of 113 m/min, and abrasive slurry containing abrasive grains of colloidal silica, the polishing efficiency in the use of only an epoxy resin was 0.18 $\mu$m/min, however, the polishing efficiency in the use of an epoxy resin containing $CaCO_3$ fine powder of 30% (W/N) having a particle diameter of 20–50 $\mu$m was 0.75 $\mu$m/min. This value is approximately equivalent to 0.90 $\mu$m/min for silicon and is therefore suitable for polishing of a silicon wafer.

The present invention can be applied for polishing for an Si wafer, an $SiO_2$ mask, an SOI wafer and the like.

Figure 5:
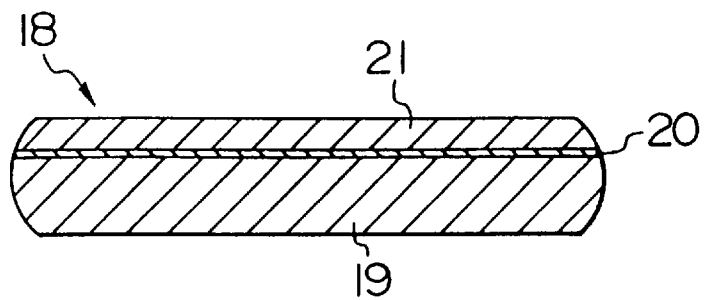
FIG. 5 is a vertical sectional view of a useful example to which the present invention can be applied.

FIG. 5 shows an SOI wafer 18 which comprises an Si substrate 19 having a thickness of 600–800 $\mu$m and an Si layer 21 having a thickness of 1±0.3 $\mu$m formed on the Si substrate 19 through an $SiO_2$ layer 20 having a thickness of 0.5 $\mu$m. In the SOI wafer 18, the Si layer 21 requires a high uniformity of the thickness. Therefore, the present invention is very useful for making the thickness of the Si substrate 19 uniform, and for making the thickness of the Si layer 21 uniform after bonding the Si layer 21 to the Si substrate 19 through the $SiO_2$ layer 20.

Figure 6:
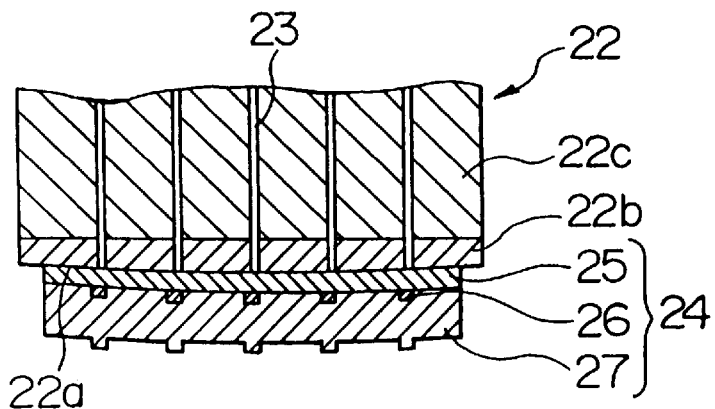
FIG. 6 is a vertical sectional view of another useful example to which the present invention can be applied.

The present invention is useful for planarization for a device, that is, for removing steps formed on the surface of $SiO_2$ film which is deposited by CVD or the like to cover wiring of such materials as metal, metal silicide, polysilicon or the like provided on an Si substrate. FIG. 6 shows a useful application of the present invention for such a processing. In FIG. 6, the surface member 22b for holding a thin plate 1, of the holding plate 22 is made of $SiO_2$ which is the same material as the object to be polished. The plate body 22c of the holding plate 22 is made of $Al_2O_3$ or the like. In the holding plate 22, a plurality of through holes 23 which pass through the surface member 22b and the plate body 22c, are formed for holding to secure the wafer 1 on the holding surface 22a of the surface member 22b by vacuum suction. A wafer 24 comprises an Si substrate 25, wiring 26 having a thickness of about 1 $\mu$m which is disposed on the lower surface of the Si substrate 25, and an $SiO_2$ film 27 formed thereon to cover the wiring 26 and the Si substrate 25.

The $SiO_2$ film 27 has a high uniformity of thickness in the whole region of the wafer 24, however, minute steps, i.e., unevenness having a thickness of about 1 $\mu$m, are formed on the lower surface thereof at positions corresponding to the wiring 26. Therefore, the polishing process for the $SiO_2$ film 27 requires the removal of the steps with keeping a high uniformity of thickness in the whole region of the wafer 24. In order to meet the requirement, the present invention can be applied. That is, the holding surface 22a of the surface member 22b is polished by using the polishing pad 7 for polishing the $SiO_2$ film 27 under the same polishing condition as polishing for the $SiO_2$ film 27. Thereafter, the $SiO_2$ film 27 is polished by the polishing pad 7, in the same manner and under the same polishing condition, as the preceding polishing step for the holding surface 22a, so that it is possible to obtain a wafer 24 having a high flatness.

In the above-described embodiments, only the cases that the portion to be polished of the wafer is made of silicon or $SiO_2$, are explained. However, it is of course that the present invention is not limited to these cases. Basically, the present invention has no limitation with respect to the material to be polished, for example, it can be applied to a polishing for various types of compound semiconductor substrates, a general polishing for a thin plate other than a wafer, and the like.

What is claimed is:

1. A method for polishing a thin plate, comprising the steps of:

rotating a holding plate on a holding plate surface of which the thin plate is held to adhere;

bringing the thin plate held on the rotating plate into contact with a polishing pad mounted on a turn table surface of a rotating turn table, to polish the thin plate; and polishing the holding plate surface of the holding plate by using the polishing pad for polishing the thin plate before the thin plate is held to adhere on the holding plate surface of the holding plate.

2. A method for polishing a thin plate, as claimed in claim 1; wherein the step of polishing for the holding plate surface of the holding plate is carried out under the same condition as that of the thin plate.

3. A method for polishing a thin plate, as claimed in claim 1; wherein the holding plate surface of the holding plate is made of the same material as the thin plate, and the step of polishing for the holding plate surface of the holding plate is carried out under the same condition as that of the thin plate.

4. A method for polishing a thin plate, as claimed in claim 1; wherein the thin plate is one selected from the group consisting of a Si wafer, a $SiO_2$ mask, and a SOI wafer.

5. A method for polishing a thin plate, as claimed in claim 1; wherein the thin plate comprises a semiconductor substrate, a wiring formed on the substrate, and an insulating film deposited on the wiring and the substrate, and the method is performed for planarization of the insulating film of the thin plate.

6. A polishing apparatus for polishing a thin plate, comprising:

a rotatable holding plate for holding to adhere the thin plate on a surface thereof; and a rotatable turn table having a polishing pad thereon, for polishing the thin plate by bringing the rotating thin plate into contact with the rotating polishing pad;

wherein the surface of the holding plate, for holding to adhere the thin plate is made of a material which is polished in approximately the same degree as the thin plate when the surface is polished under the same polishing condition as that of the thin plate.

7. A polishing apparatus as claimed in claim 6, wherein a plurality of through holes for vacuum suction are formed in the holding plate.

8. A polishing apparatus as claimed in claim 6, wherein the surface of the holding plate, for holding to adhere the thin plate comprises a fine powder of material which is polished in approximately the same degree as the thin plate when the surface is polished under the same polishing condition as that of the thin plate, and a binding resin material for binding the fine powder material.

9. A polishing apparatus as claimed in claim 6, wherein the holding plate comprises a surface member for holding to adhere the thin plate on one surface thereof, which is made of a material which is polished in approximately the same degree as the thin plate when the one surface is polished under the same polishing condition as that of the thin plate, and a plate body attached to the surface member.

10. A polishing apparatus as claimed in claim 9, wherein the surface member is made of Si single crystal and the plate body is made of $Al_2O_3$.

11. A polishing apparatus as claimed in claim 9, wherein the surface member comprises a fine powder of Si or $CaCO_3$, and a binding resin material for binding the fine powder.

12. A polishing apparatus as claimed in claim 11, wherein the binding resin material is an epoxy resin and the plate body is made of $Al_2O_3$, and a plurality of through holes for vacuum suction are formed through the surface member and the plate body.

13. A polishing apparatus for polishing a thin plate, comprising:

a rotatable holding plate for holding to adhere a Si thin plate on a surface thereof; and a rotatable turn table having a polishing pad thereon, for polishing the Si thin plate by bringing the rotating Si thin plate into contact with the rotating polishing pad;

wherein the surface of the holding plate, for holding to adhere the Si thin plate is made of Si.

14. A polishing apparatus for polishing a thin plate, comprising:

a rotatable holding plate for holding to adhere a Si thin plate on a surface thereof; and a rotatable turn table having a polishing pad thereon, for polishing the Si thin plate by bringing the rotating Si thin plate into contact with the rotating polishing pad;

wherein the surface of the holding plate, for holding to adhere the thin plate comprises a Si fine powder and a binding resin material for binding the Si fine powder.

* * * * *